(12) United States Patent  
Shen et al.

(10) Patent No.: US 11,602,060 B2  
(45) Date of Patent: Mar. 7, 2023

(54) REAR HOUSING ASSEMBLY AND DISPLAY DEVICE

(71) Applicants: K-Tronics (Suzhou) Technology Co., Ltd., Suzhou (CN); BOE TECHNOLOGY GROUP CO., LTD., Beijing (CN)

(72) Inventors: Shengchang Shen, Beijing (CN); Weifeng Wang, Beijing (CN); Zijian Guo, Beijing (CN)

(73) Assignees: K-Tronics (Suzhou) Technology Co., Ltd., Suzhou (CN); BOE TECHNOLOGY GROUP CO., LTD., Beijing (CN)

( * ) Notice: Subject to any disclaimer, the term of this patent is extended or adjusted under 35 U.S.C. 154(b) by 22 days.

(21) Appl. No.: 17/278,063

(22) PCT Filed: Sep. 29, 2019

(86) PCT No.: PCT/CN2019/109226  
§ 371 (c)(1),  
(2) Date: Mar. 19, 2021

(87) PCT Pub. No.: WO2021/056578  
PCT Pub. Date: Apr. 1, 2021

(65) Prior Publication Data  
US 2021/0392763 A1 Dec. 16, 2021

(51) Int. Cl.  
*H04R 1/02* (2006.01)  
*H05K 5/02* (2006.01)

(52) U.S. Cl.  
CPC ........... *H05K 5/0217* (2013.01); *H04R 1/028* (2013.01); *H04R 2499/15* (2013.01)

(58) Field of Classification Search  
CPC ............................... H05K 5/0217; H04R 1/02  
See application file for complete search history.

(56) References Cited

U.S. PATENT DOCUMENTS 9,015,976 B2 4/2015 Moon  
2014/0208626 A1 7/2014 Moon

FOREIGN PATENT DOCUMENTS

CN 101666424 A 3/2010  
CN 101666424 B 5/2011  
(Continued)

OTHER PUBLICATIONS

International Search Report and Written Opinion for International Application No. PCT/CN2019/109226 dated Jun. 24, 2020.

(Continued)

*Primary Examiner* — Olisa Anwah  
(74) *Attorney, Agent, or Firm* — Perilla Knox & Hildebrandt LLP; Kenneth A. Knox (57) ABSTRACT

The present disclosure relates to the technical field of display devices, in particular, to a rear housing assembly and a display device. The rear housing assembly includes: a rear housing, a back plate, and a connecting assembly. The back plate and the rear housing are disposed oppositely in a thickness direction of the display device. The connecting assembly includes a first connecting part and a second connecting part. One of the first connecting part and the second connecting part is coupled to the rear housing, and the other is coupled to the back plate. The first connecting part includes a limiting cavity extending in the thickness direction, the second connecting part includes a limiting engaging portion, the limiting engaging portion extends into the limiting cavity, and the limiting engaging portion is engaged with the first connecting part.

20 Claims, 7 Drawing Sheets

(56) References Cited

FOREIGN PATENT DOCUMENTS

| | | |
|---|---|---|
| CN | 103075399 A | 5/2013 |
| CN | 103244917 A | 8/2013 |
| CN | 203757604 U | 8/2014 |
| CN | 103244917 B | 8/2016 |
| CN | 205647984 U | 10/2016 |
| CN | 106402121 A | 2/2017 |
| CN | 107743291 A | 2/2018 |
| CN | 207506745 U | 6/2018 |
| CN | 207706309 U | 8/2018 |
| CN | 109040635 A | 12/2018 |

OTHER PUBLICATIONS

First Office Action for CN Patent Application No. 201980001840.0 dated Dec. 23, 2021.
Second Office Action for CN Patent Application No. 201980001840.0 dated May 18, 2022.

REAR HOUSING ASSEMBLY AND DISPLAY DEVICE

CROSS-REFERENCE TO RELATED APPLICATION

The present application is a 35 U.S.C. 371 national phase application of International Application No. PCT/CN2019/109226, filed on Sep. 29, 2020, the entire disclosure of which is incorporated herein by reference.

TECHNICAL FIELD

The present disclosure relates to the technical field of display devices and, in particular, to a rear housing assembly and a display device.

BACKGROUND

A display device usually includes a speaker. In an area of the display device where a woofer is equipped, a rear housing of the display device is required not to be at a higher level than the woofer due to an appearance design. However, due to aesthetic considerations during the appearance design, the woofer has been almost completely fitted to the rear housing.

Therefore, there is no too much space between the woofer and the rear housing, and it is impossible to design ribs and other structures, resulting in a weak middle area of the rear housing. Thus, the middle area is deformed and arched beyond a dust cover of the woofer, which seriously affects appearance of the display device.

It should be noted that the information disclosed in the Background section above is only for enhancing the understanding of the background of the present disclosure, and thus may include information that does not constitute prior art known to those of ordinary skill in the art.

SUMMARY

A first aspect of the present disclosure provides a rear housing assembly for a display device, and the rear housing assembly includes:
a rear housing;
a back plate, wherein the back plate and the rear housing are disposed oppositely in a thickness direction of the display device; and
a connecting assembly, including a first connecting part and a second connecting part, wherein one of the first connecting part and the second connecting part is coupled to the rear housing, and the other of the first connecting part and the second connecting part is coupled to the back plate; and the first connecting part includes a limiting cavity extending in the thickness direction, the second connecting part includes a limiting engaging portion, the limiting engaging portion extends into the limiting cavity, and the limiting engaging portion is engaged with the first connecting part.

In an exemplary embodiment of the present disclosure, the first connecting part further includes a first cylindrical side wall, the first cylindrical side wall forms the limiting cavity, and the first cylindrical side wall is provided with a clamping hole; and the second connecting part further includes a second cylindrical side wall, the limiting engaging portion is disposed on an outer side of the second cylindrical side wall in a protruding manner, and the limiting engaging portion is capable of extending into the limiting cavity and is clamped in the clamping hole.

In an exemplary embodiment of the present disclosure, a first mounting plate is disposed at an opening of a first end of the first cylindrical side wall, a first mounting portion is disposed on the back plate, and the first mounting plate is detachably coupled to the first mounting portion by a fastener.

In an exemplary embodiment of the present disclosure, one of the first mounting plate and the mounting portion is provided with a positioning slot, and the other of the first mounting plate and the mounting portion is provided with a positioning protrusion, wherein the positioning protrusion is located in the positioning slot.

In an exemplary embodiment of the present disclosure, a second end of the first cylindrical side wall is open, and an edge of the second end of the first cylindrical side wall is inclined outward.

In an exemplary embodiment of the present disclosure, a notch is disposed on the second end of the first cylindrical side wall.

In an exemplary embodiment of the present disclosure, an end of the second cylindrical side wall close to the first connecting part is provided with a second mounting plate, a second mounting portion is disposed on the rear housing, and the second mounting plate is detachably coupled to the second mounting portion by a fastener.

In an exemplary embodiment of the present disclosure, a second notch is disposed on a second end of the second cylindrical side wall, a positioning sheet is disposed on the second mounting portion, and the positioning sheet is located in the second notch.

In an exemplary embodiment of the present disclosure, the second connecting part further includes a limiting arm, the limiting arm is disposed on the outer side of the second cylindrical side wall in a protruding manner, and the limiting arm is located on a side of the limiting engaging portion away from the first connecting part.

In an exemplary embodiment of the present disclosure, a plurality of clamping holes are disposed along a circumferential direction of the first cylindrical side wall, and the number of the limiting engaging portions is same as the number of the clamping holes.

In an exemplary embodiment of the present disclosure, the first connecting part is provided with two clamping holes, and the two clamping holes are symmetrically distributed on the first cylindrical side wall.

In an exemplary embodiment of the present disclosure, the first connecting part is same as the second connecting part.

In an exemplary embodiment of the present disclosure, the rear housing assembly further includes a sounding device disposed between the rear housing and the back plate. The sounding device is provided with an avoiding hole, an end of the first connecting part is coupled to the back plate, and the limiting cavity at the other end of the first connecting part extends into the avoiding hole. An end of the second connecting part is coupled to the rear housing, and the limiting engaging portion at the other end of the second connecting part extends into the avoiding hole and is located within the limiting cavity.

In an exemplary embodiment of the present disclosure, the first connecting part includes a first supporting wall and a second supporting wall disposed on the back plat oppositely, and a connecting plate connecting the first supporting wall and the second supporting wall. The connecting plate is provided with a through hole, and the connecting plate cooperates with the first supporting wall and the second supporting wall to form the limiting cavity. The second connecting part further includes a connecting arm, a first end of the connecting arm is coupled to the rear housing, the limiting engaging portion is disposed at a second end of the connecting arm in a protruding manner, and the limiting engaging portion is capable of extending into the through hole and being clamped with the connecting plate via the through hole.

In an exemplary embodiment of the present disclosure, the first connecting part further includes a first fixing arm and a second fixing arm, wherein the first fixing arm is coupled to an end of the first supporting wall away from the connecting plate, and the second fixing arm is coupled to an end of the second supporting wall away from the connecting plate. The first fixing arm and the second fixing arm are detachably coupled to the back plate, respectively.

In an exemplary embodiment of the present disclosure, the first fixing arm is disposed on a side of the first supporting wall away from the second supporting wall, and the second fixing arm is disposed on a side of the second supporting wall away from the first supporting wall.

In an exemplary embodiment of the present disclosure, a plurality of connecting arms and a plurality of limiting engaging portion are provided, and there are gaps between the plurality of connecting arms.

A second aspect of the present disclosure provides a display device, which includes the above-mentioned rear housing assembly.

It should be noted that the above general description and the following detailed description are merely exemplary and explanatory, and should not be construed as limiting of the present disclosure.

BRIEF DESCRIPTION OF THE DRAWINGS

The accompanying drawings, which are incorporated in the specification and constitute a part of the specification, show exemplary embodiments of the present disclosure. The drawings along with the specification explain the principle of the present disclosure. It is apparent that the drawings in the following description show only some of the embodiments of the present disclosure, and other drawings may be obtained by those skilled in the art without departing from the drawings described herein.

DETAILED DESCRIPTION

Example embodiments will now be described more fully with reference to the accompanying drawings. However, the embodiments may be implemented in a variety of forms and should not be construed as being limited to the examples set forth herein. Rather, these embodiments are provided so that the present disclosure will be more complete so as to convey the idea of the exemplary embodiments to those skilled in the art. The same reference numerals in the drawings denote the same or similar parts, and the repeated description thereof will be omitted.

Although the relative terms such as "above" and "below" are used in the specification to describe the relative relationship of one component to another component shown, these terms are only for convenience in the specification, for example, according to an exemplary direction shown in the drawings. It will be understood that if the device shown is flipped upside down, the component described as "above" will become a component "below" another component. When a structure is "on" another structure, it may mean that a structure is integrally formed on another structure, or that a structure is "directly" disposed on another structure, or that a structure is "indirectly" disposed on another structure through other structures.

The terms "one", "a", "the", "said", and "at least one" are used to indicate that there are one or more elements/components or the like. The terms "include", "contain" and "have" are used to indicate an open meaning of including, and means that there may be additional elements/components/etc., in addition to the listed elements/components/etc. The terms "first" and "second" etc. are used only as markers, and do not limit the number of objects.

Description of reference numerals: 10 rear housing, 110 second mounting portion, 120 positioning sheet, 130 screw; 20 back plate, 210 first mounting portion, 220 positioning protrusion; 30 first connecting portion, 310 first cylindrical side wall, 320 first mounting plate, 330 first via hole, 340 first positioning slot, 350 first clamping hole, 360 first limiting engaging portion, 370 first limiting arm, 380 first eversion portion, 390 first notch; 40 second connecting portion, 410 second cylindrical side wall, 420 second mounting plate, 430 second via hole, 440 second positioning slot, 450 second clamping hole, 460 second limiting engaging portion, 470 second limiting arm, 480 second eversion portion, 490 second notch; 50 bracket, 510 first supporting wall, 520 second supporting wall, 530 third supporting wall, 540 fourth supporting wall, 550 connecting plate, 560 through hole, 570 first fixing arm, 580 second fixing arm; 60 clamping head, 610 first connecting arm, 620 second connecting arm, 630 first chuck, 640 second chuck, 650 reinforcing rib; and 70 sounding device, 710 speaker, 720 avoiding hole.

Embodiments of the present disclosure provide a rear housing assembly for a display device, as shown in FIGS. 1 to 10. The rear housing assembly includes: a rear housing 10, a back plate 20 and a connecting assembly. The back plate 20 and the rear housing 10 are disposed oppositely in a thickness direction of the display device. The connecting assembly includes a first connecting part and a second connecting part. One of the first connecting part and the second connecting part is coupled to the rear housing 10, and the other of the first connecting part and the second connecting part is coupled to the back plate 20. The first connecting part includes a limiting cavity extending in the thickness direction, the second connecting part includes a limiting engaging portion, the limiting engaging portion extends into the limiting cavity, and the limiting engaging portion is engaged with the first connecting part. The back plate 20 is a structure in a backlight module for carrying a light guide plate, a backlight source, an optical module and the like. The rear housing is a housing of the display device to package various structures such as various circuit boards, various sounding devices in the display device.

In the rear housing assembly provided by the present disclosure, the rear housing 10 is clamped with the back plate 20 by the first connecting part and the second connecting part. This may prevent the middle area of the rear housing from deforming and arching relative to the back plate 20, and may also reduce a length of the connecting part to prevent the connecting part from breaking. Also, a horizontal displacement is restricted by configuring the limiting engaging portion to extend into the limiting cavity. Besides, the limiting engaging portion is engaged with the first connecting part to limit its displacement in the thickness direction, thus realizing multi-directional engagement.

First Implementation

Figure 6:
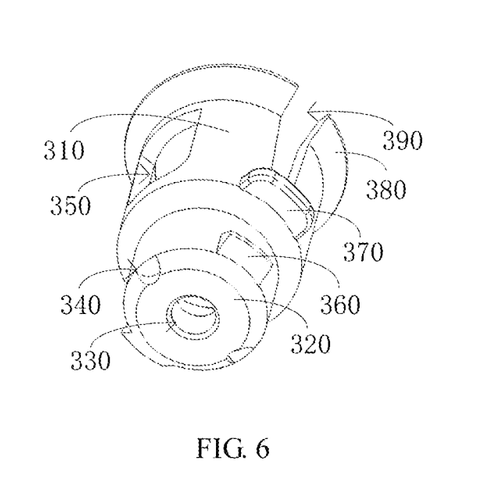
FIG. 6 is a schematic diagram of a first connecting part provided by an embodiment of the present disclosure.

In an embodiment, as shown in FIG. 6, the first connecting part 30 further includes a first cylindrical side wall 310, the first cylindrical side wall 310 is provided with a first clamping hole 350, and the first cylindrical side wall 310 forms the limiting cavity. The second connecting part 40 further includes a second cylindrical side wall 410, the second limiting engaging portion 460 is disposed on an outer side of the second cylindrical side wall 410 in a protruding manner, and the second limiting engaging portion 460 is capable of extending into the limiting cavity and is clamped in the first clamping hole 350.

Figure 1:
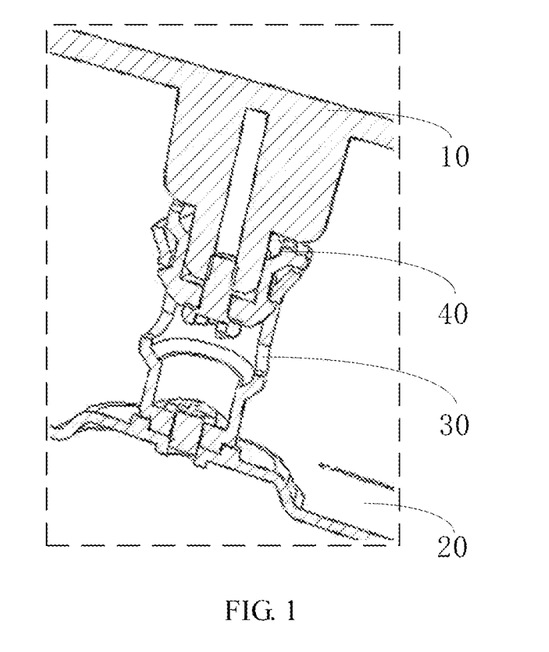
FIG. 1 is a cross-sectional view of a rear housing assembly provided by an embodiment of the present disclosure.
Figure 2:
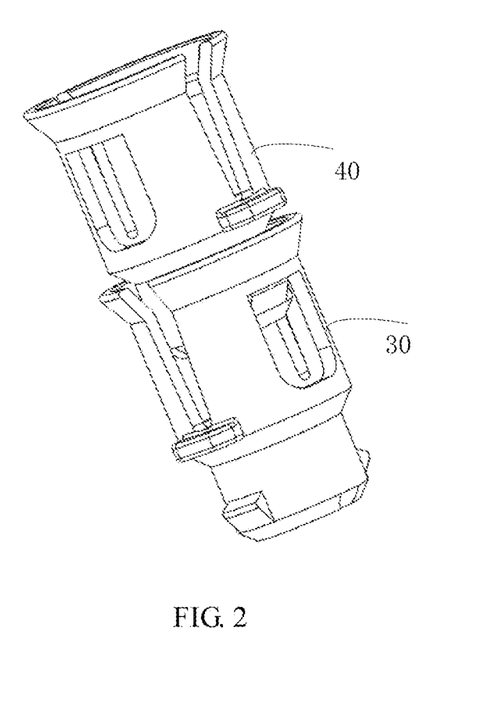
FIG. 2 is a schematic diagram of a connecting assembly provided by an embodiment of the present disclosure.
Figure 3:
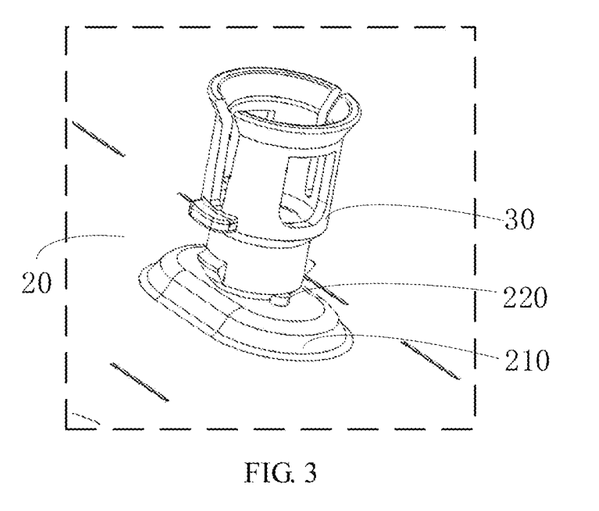
FIG. 3 is a schematic diagram of a connection between a first connecting part and a back plate provided by an embodiment of the present disclosure.

In an embodiment, as shown in FIG. 3, the first connecting part 30 is provided with two first clamping holes 350, and the two first clamping holes 350 are symmetrically distributed on the first cylindrical side wall 310. For example, one, two, three or more first clamping holes 350 may be disposed along a circumferential direction of the first cylindrical side wall 310. A shape of the first engaging hole 350 may be rectangular, circular, elliptical, polygonal, or irregular or the like. A size of the first clamping hole 350 may be designed according to a size of the limiting engaging portion. Shapes and sizes of the multiple first clamping holes 350 may be the same or different, as long as clamping conditions are met. Cross sections of the first cylindrical side wall 310 and the second cylindrical side wall 410 may be circular, elliptical, rectangular, polygonal, or irregular or the like. The shape and the size of the side wall 310 match with the shape and the size of the second cylindrical side wall 410.

In a further embodiment, as shown in FIGS. 3 and 6, the first connecting part 30 further includes a first mounting plate 320 disposed at an end of the first cylindrical side wall 310, a first mounting portion 210 is disposed on the back plate 20, and the first mounting plate 320 is detachably coupled to the first mounting portion 210 by a fastener. Specifically, the first mounting plate 320 is provided with a first via hole 330, and the first mounting portion includes a threaded hole. When the first connecting part 30 is coupled to the back plate 20, the first mounting portion is a partial area on the back plate 20, where the threaded hole is formed. Then, a threaded part is used, for example, a screw is used, to connect the first mounting plate 320 to the threaded hole, so as to realize the detachable connection between the first connecting part 30 and the back plate 20. Alternatively, a screw pillar with internal threads is formed in this partial area, with no need to drill a hole on the back plate 20, and then the first mounting plate 320 is connected with the threaded hole via the screw.

In addition, when the first connecting part 30 is coupled to the rear housing 10, the mounting portion may be a partial area on the rear housing 10, where the crew pillar with internal threads is formed, and there is no need to drill a hole on the back plate 20. Then, the first mounting plate 320 is connected with the threaded hole via the screw. When the rear housing 10 is viewed from outside, no screw hole will be seen, which improves appearance appreciation. In addition, the use of two connecting parts may also reduce a height of the screw pillar, thereby reducing the manufacturing difficulty of the screw pillar and avoiding a situation in which the screw pillar breaks.

In an embodiment, one of the first mounting plate 320 and the mounting portion is provided with a positioning slot, and the other of the first mounting plate 320 and the mounting portion is provided with a positioning protrusion, wherein the positioning protrusion is located in the positioning slot. As shown in FIG. 3, the first mounting plate 320 is provided with two first positioning slots 340 at opposite positions, and the first mounting portion 210 is provided with two first positioning protrusions 220 at opposite positions. After the first mounting plate 320 is coupled to the first mounting portion 210, the positioning protrusion 220 is located in the positioning slot to position a connection between the first mounting plate 320 and the mounting portion, while preventing the first connecting part 30 from rotating relative to the mounting portion after connection. The number of the first positioning slots 340 and the number of the positioning protrusions 220 may be the same, for example, one, three, four or more. The number of the first positioning slots 340 may also be more than the number of the positioning protrusions, as long as the shape and the size of the first positioning slot 340 match with the shape and the size of the positioning protrusion. The present disclosure is not limited in this regard, as long as the positioning effect can be achieved.

As shown in FIGS. 3 and 6, a second end of the first cylindrical side wall 310 is open, and an edge of the second end of the first cylindrical side wall 310 is inclined outwards, so as to form a first eversion portion 380 at the second end of the first cylindrical side wall 310. The arrangement of the first eversion portion 380 helps to form a guide for the second limiting engaging portion 460 of the second connecting part 40, thus facilitating the second limiting engaging portion 460 to extend into the limiting cavity.

As shown in FIG. 6, an end of the first cylindrical side wall 310 away from the first mounting plate 320 is provided with a first notch 390. That is, an edge of the open end is provided with the notch. The arrangement of the first notch 390 facilitates the deformation of the first cylindrical side wall 310 when the second limiting engaging portion 460 of the second connecting part 40 is inserted into the open end. Thus, the second limiting engaging portion 460 is moved into the first clamping hole 350 to avoid the first cylindrical side wall 310 to be broken due to a large deformation force received. This improves the reliability of the first connecting part 30. Two first notches 390 are disposed on the first cylindrical side wall 310 oppositely, and there may be one, three, four or more first notches 390 as well. A width and a depth of the first notch 390 may be designed according to an actual situation, and the present disclosure is not limited in this regard.

Figure 7:
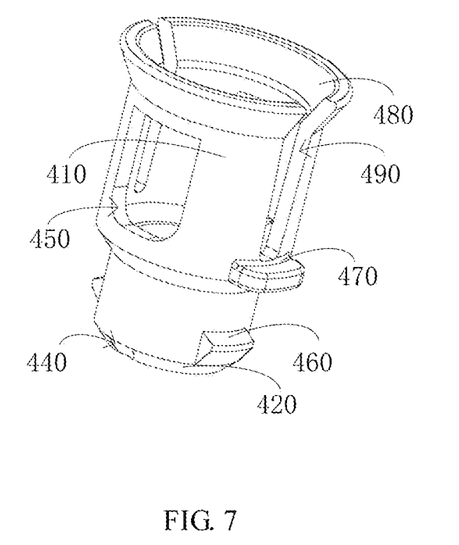
FIG. 7 is a schematic diagram of a second connecting part provided by an embodiment of the present disclosure.

As shown in FIG. 7, the second connecting part 40 includes a second cylindrical side wall 410, and the second limiting engaging portion 460 is disposed on the outer side of the second cylindrical side wall 410 in a protruding manner. A side of the second limiting engaging portion 460 facing the first connecting part 30 is an inclined surface that gradually deviates away from the first connecting part 30, so as to facilitate the second limiting engaging portion 460 to slide in along an inner wall of the first cylindrical side wall 310. A plurality of second limiting engaging portions 460 are disposed along the circumferential direction of the first cylindrical side wall 310. The number of the first clamping holes 350 and the number of the second limiting engaging portions 460 are the same. Each of the second limiting engaging portions 460 is clamped with a respective first clamping hole 350 in a one-to-one correspondence.

Figure 4:
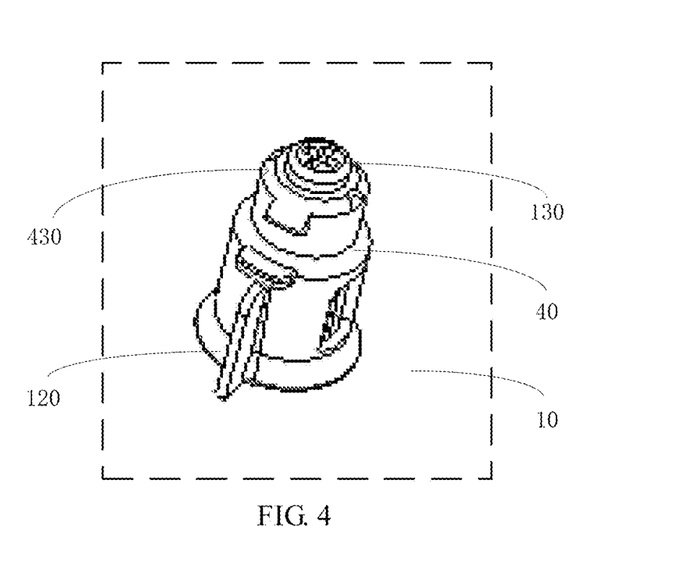
FIG. 4 is a schematic diagram of a connection between a second connecting part and a rear housing provided by an embodiment of the present disclosure.
Figure 5:
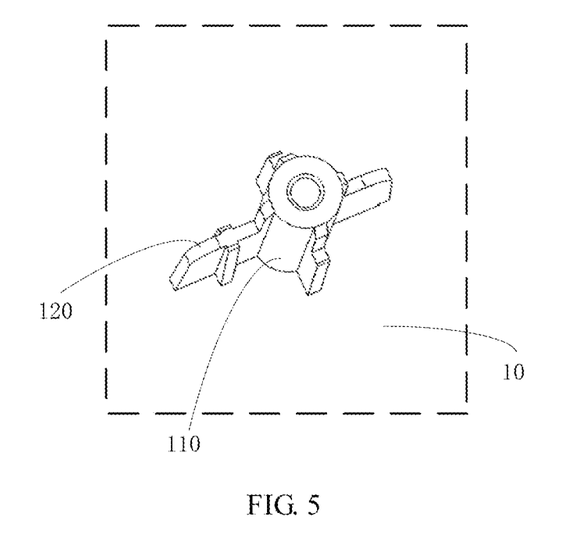
FIG. 5 is a schematic diagram of a mounting portion on a rear housing provided by an embodiment of the present disclosure.

As shown in FIGS. 4 and 7, an end of the second cylindrical side wall 410 close to the first connecting part 30 is provided with a second mounting plate 420, and a second mounting portion 110 is disposed on the rear housing 10, wherein the second mounting plate 420 is detachably coupled to the second mounting portion 110 by a fastener. Specifically, the second mounting plate 420 is provided with a second via hole 430, the second mounting portion 110 includes a threaded hole, and the second mounting plate 420 is coupled to the second mounting portion 110 via a threaded member. When the second connecting part 40 is coupled to the rear housing 10, the second mounting portion 110 is a partial area on the rear housing 10, where the screw pillar with internal threads is formed, and there is no need to drill the hole on the back plate 20. Then, the first mounting plate 320 is connected with the threaded hole via the screw 130. When the rear housing 10 is viewed from outside, no screw hole will be seen, which improves appearance appreciation. In addition, the use of two connecting parts may also reduce a height of the screw pillar, thereby reducing the manufacturing difficulty of the screw pillar and avoiding a situation in which the screw pillar breaks.

As shown in FIG. 7, a second end of the second cylindrical side wall 410 is open, and an edge of the second end of the second cylindrical side wall 410 is inclined outwardly, so as to form a second eversion portion 480 at the second end of the second cylindrical side wall 410. An end of the second cylindrical side wall 410 away from the second mounting plate 420 is provided with a second notch 490. That is, a notch is disposed on the edge of the open end. The second mounting portion 110 is provided with a positioning sheet 120, and the number of the positioning sheets 120 is same as the number of the second notches 490. After the second connecting part 40 is coupled to the rear housing 10, the positioning sheet 120 is inserted into the second notch 490 to position between the second connecting part 40 and the rear housing 10, thus preventing the second connecting part 40 from rotating relative to the rear housing 10.

In another embodiment, when the second connecting part 40 is coupled to the back plate 20, the second mounting portion 110 is a partial area on the back plate 20, where the threaded hole is formed. Then, a threaded member is used, for example, a screw is used, to connect the second mounting plate 420 with the threaded hole. In this way, a detachable connection is accomplished between the second connecting part 40 and the back plate 20. Alternatively, a screw pillar with internal threads is formed in this partial area, with no need to drill a hole on the back plate 20, and then the second mounting plate 320 is connected with the threaded hole via the screw.

In addition, the second connecting part 40 is not limited to be coupled to the rear housing 10, but may also be coupled to the back plate 20. When the second connecting part 40 is coupled to the back plate 20, one of the second mounting plate 420 and the mounting portion may be provided with a positioning slot, and the other of the second mounting plate 420 and the mounting portion is provided with a positioning protrusion. After the second mounting plate 420 is coupled to the mounting portion of the back plate 20, the positioning protrusion is located in the positioning slot. For example, after the second mounting plate 420 is provided with two second positioning slots 440 at opposite positions, the mounting portion is provided with two positioning protrusions at opposite positions, and the second mounting plate 420 is coupled to the mounting portion, the positioning protrusion is located in the second positioning slot 440 to position a connection between the second mounting plate 420 and the mounting portion, while preventing the second connecting part 40 from rotating relative to the mounting portion after connection. The number of the second positioning slots 440 may be same as the number of the positioning protrusions, for example, one, three, four or more. The number of the second positioning slots 440 may also be more than the number of the positioning protrusions, as long as the shape and the size of the second positioning slot 440 match with the shape and the size of the positioning protrusion. The present disclosure is not limited in this regard, as long as the positioning effect can be achieved.

As shown in FIG. 7, the second connecting part 40 further includes a second limiting arm 470. The second limiting arm 470 is disposed on the outer side of the second cylindrical side wall 410 in a protruding manner, and the second limiting arm 470 is located on a side of the second limiting engaging portion 460 away from the first connecting part 30. The arrangement of the second limiting arm 470 helps to form a limit for a depth of the second connecting part 40 extending into the first connecting part 30, so as to prevent the second limiting engaging portion 460 from sliding out of the first clamping hole 350 and moving towards the first mounting plate 320 when the rear housing 10 receives a pressing force. Thus, the first cylindrical side wall 310 is prevented from being broken by the second limit clamping portion 460, thereby improving the reliability of the connecting assembly.

In an embodiment, the first connecting part 30 and the second connecting part 40 may be the same to reduce the manufacturing cost of the connecting parts. That is to say, the first connecting part 30 may include a first limiting arm 370 and a first limiting engaging portion 360, wherein the first limiting arm 370 is disposed on the first cylindrical side wall 310, and the first limiting engaging portion 360 is located on a side away from the first mounting plate 320. The second connecting part 40 may include a second clamping hole 450 disposed on the second cylindrical side wall 410. When the first connecting part 30 and the second connecting part 40 are the same, the first connecting part 30 and the second connecting part 40 may be prevented from being assembled incorrectly. That is, when installing the first connecting part 30 and the second connecting part 40, the installation positions may be replaced at will to improve the assembly yield of product and reduce the difficulty of the assembly process.

In an embodiment, the first connecting part 30 and the second connecting part 40 of the present disclosure are integrally formed structures, respectively. This improves the structural strength of the first connecting part 30 and the second connecting part 40. In addition, the first connecting part 30 and the second connecting part 40 may be formed by assembling multiple components by bonding, welding, or the like.

Figure 11:
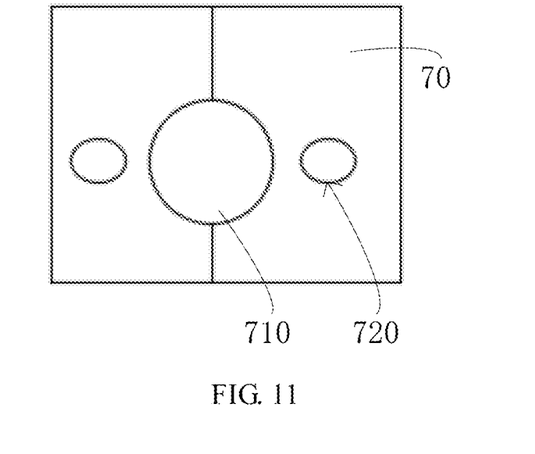
FIG. 11 is a schematic diagram of a sounding device provided by an embodiment of the present disclosure.
Figure 12:
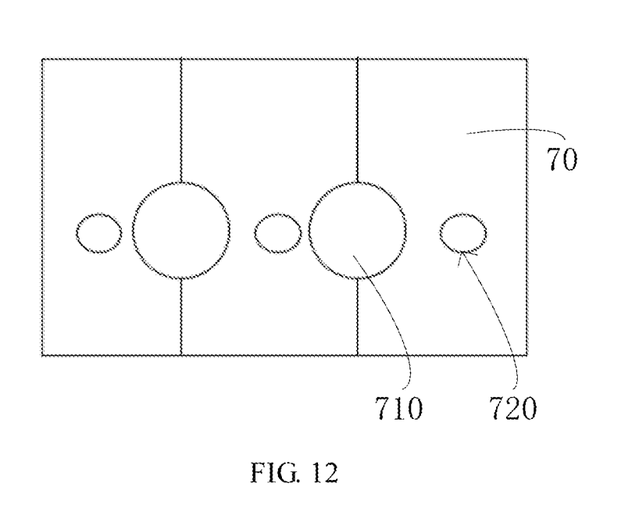
FIG. 12 is a schematic diagram of a sounding device provided by another embodiment of the present disclosure.
Figure 13:
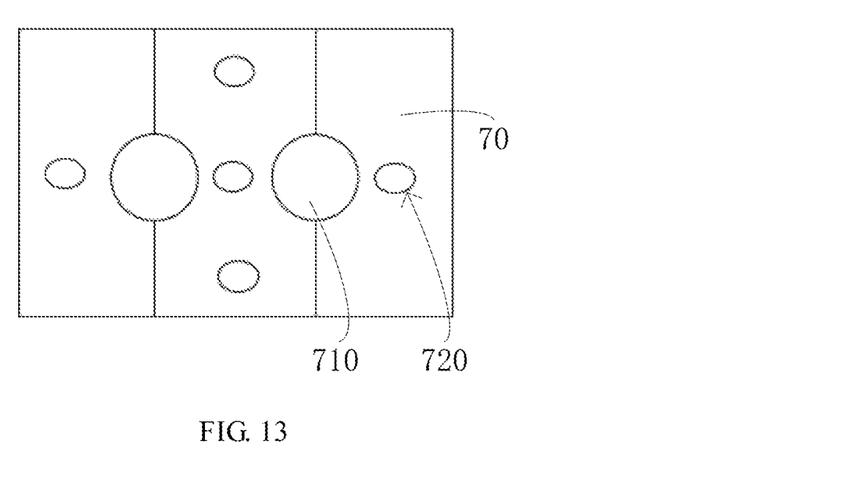
FIG. 13 is a schematic diagram of a sounding device provided by yet another embodiment of the present disclosure.

In addition, the rear housing assembly further includes a sounding device 70, disposed between the rear housing 10 and the back plate 20. The sounding device 70 is provided with a speaker 710 and an avoiding hole 720. An end of the first connecting part 30 is coupled to the back plate 20, and the limiting cavity at the other end of the first connecting part 30 extends into the avoiding hole 720. An end of the second connecting part 40 is coupled to the rear housing 10, and the limiting engaging portion at the other end of the second connecting part 40 extends into the avoiding hole 720 and is located in the limiting cavity, thereby realizing the connection between the rear housing 10 and the back plate 20. As shown in FIGS. 11 to 13, the sounding device 70 is provided with a plurality of avoiding holes 720, and the plurality of avoiding holes 720 are located around the speaker 710. For example, the number of the avoiding holes 720 is two, three, five or more, and the avoiding holes 720 are located between the plurality of speakers 710 or distributed along the circumference of the speakers 710, so as to form a support for the rear housing 10 around the speakers. Thus, the middle area of the rear housing 10 is prevented from deforming and arching beyond the dust cover of the speaker and affecting the appearance of the product. In addition, the first connecting part 30 and the second connecting part 40 may also be located in any area between the rear housing 10 and the back plate 20 other than the sounding device 70.

Second Implementation

Figure 8:
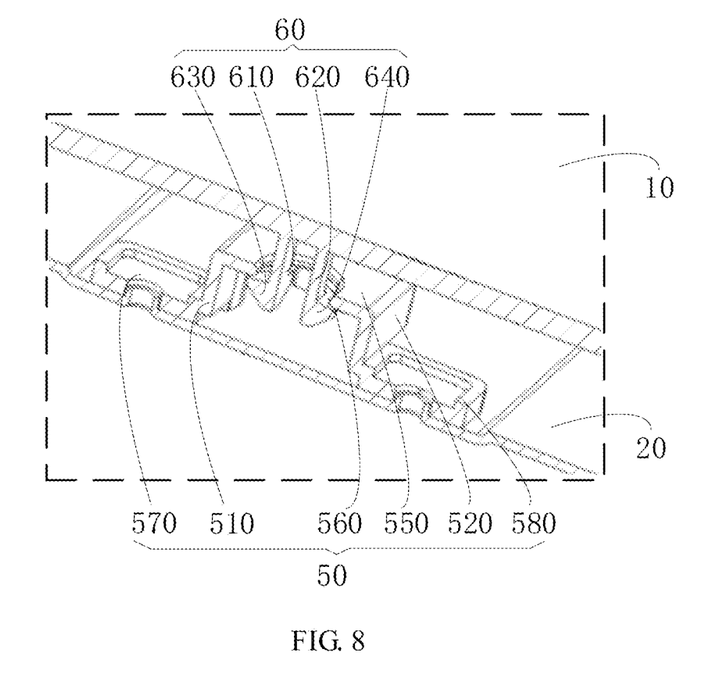
FIG. 8 is a cross-sectional view of a rear housing assembly provided by another embodiment of the present disclosure.
Figure 9:
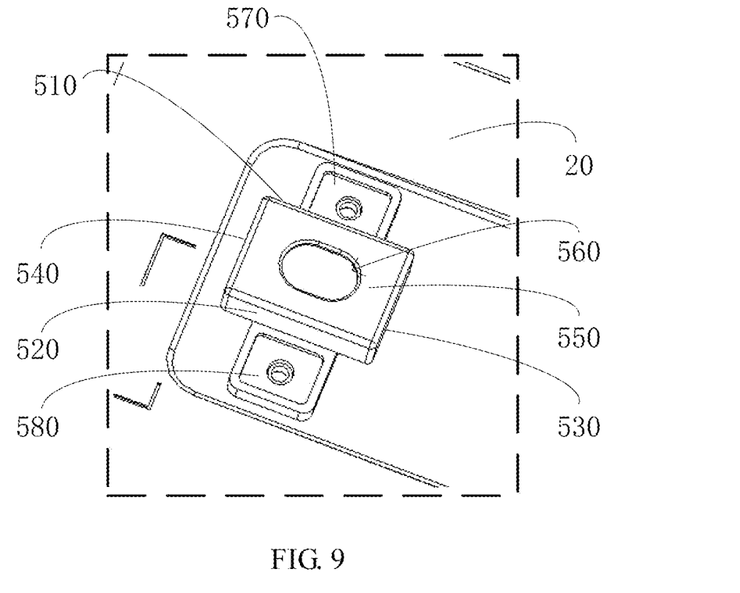
FIG. 9 is a schematic diagram of a connection between a first connecting part and a back plate provided by another embodiment of the present disclosure.
Figure 10:
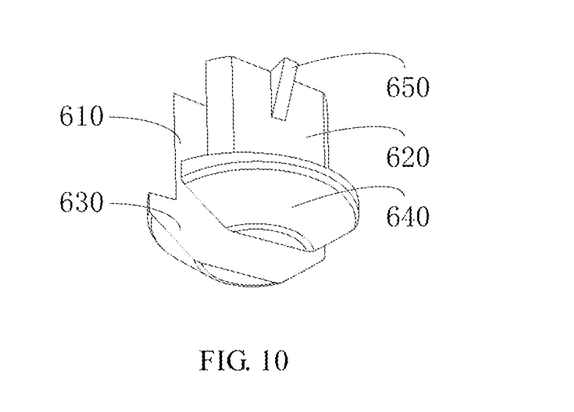
FIG. 10 is a schematic diagram of a second connecting part provided by another embodiment of the present disclosure.

When the connecting component is disposed in an area between the rear housing 10 and the back plate 20 other than the sounding device, for example, in an edge area between the rear housing 10 and the back plate 20, as shown in FIGS. 8 to 10. The first connecting part may include a bracket 50, which includes a first supporting wall 510 and a second supporting wall 520 disposed on the back plate 20, and a connecting plate 550 connecting the first supporting wall 510 and the second supporting wall 520. The connecting plate 550 is provided with a through hole 560, and the first supporting wall 510 and the second supporting wall 520 are spaced apart, so that the connecting plate 550 cooperates with the first supporting wall 510 and the second supporting wall to form the limiting cavity. The second connecting part may include an engaging head 60, and the engaging head 60 includes a connecting arm. A first end of the connecting arm is coupled to the rear housing 10, the engaging head is disposed at a second end of the connecting arm in a protruding manner, and the engaging head is capable of extending into the through hole and being clamped with the connecting plate 550 via the through hole.

In an embodiment, the second connecting part is provided with two connecting arms and a limiting engaging portion, and there are gaps between the plurality of connecting arms. As shown in FIG. 10, a first connecting arm 610 and a second connecting arm 620 are disposed. For the first connecting arm 610 and the second connecting arm 620, a second end of the first connecting arm 610 is provided with a first chuck 630, a second end of the second connecting arms 620 is provided with a second chuck 640, and projecting directions of the first chuck 630 and the second chuck 640 face away from each other. When three, four, five or more connecting arms are provided, a plurality of limiting engaging portions are distributed along the circumferential direction, and projecting directions of the limiting engaging portions are outwards respectively. As shown in FIG. 10, the engaging head 60 also includes a reinforcing rib 650 to support the connecting arm. This helps to avoid the connecting arm from being deformed too much to be broken, and improve the reliability of the connecting assembly.

In addition, the first connecting part further includes a third supporting wall 530 and a fourth supporting wall 540. The first supporting wall 510, the second supporting wall 520, the third supporting wall 530 and the fourth supporting wall 540 are connected in sequence to form a cavity. The connecting plate 550 is coupled to the first supporting wall 510, the second supporting wall 520, the third supporting wall 530 and the fourth supporting wall 540 at the same time. This increases the structural strength of the first connecting part and improves the reliability of the first connecting part.

As shown in FIG. 9, the first connecting part further includes a first fixing arm 570 and a second fixing arm 580. The first fixing arm 570 is coupled to an end of the first supporting wall 510 away from the connecting plate 550. The second fixing arm 580 is coupled to an end of the second supporting wall 520 away from the connecting plate 550. The first fixing arm 570 and the second fixing arm 580 are respectively detachably coupled to the back plate 20, so as to realize the detachable connection between the first connecting part and the back plate 20. The first fixing arm 570 and the second fixing arm 580 are provided with clamping holes respectively, and the back plate 20 is provided with a clamping pillar which may be clamped with the clamping hole. Alternatively, the first fixing arm 570, the second fixing arm 580 and the back plate 20 are respectively provided with via holes, and then connected by bolts.

In a further embodiment, the first fixing arm 570 is disposed on a side of the first supporting wall 510 away from the second supporting wall 520, and the second fixing arm 580 is disposed on a side of the second supporting wall 520 away from the first supporting wall 510. The first connecting part is in the shape of a "几" as a whole, which improves the connection stability of the first connecting part on the back plate 20.

In addition, the bracket 50 and the engaging head 60 of the present disclosure may be integrally formed structures respectively, and the engaging head 60 may be an integrally formed structure with the rear housing 10, so as to increase the strength of the connecting assembly. Understandably, the bracket 50 and the engaging head 60 may be formed by assembling multiple components by bonding, welding, or the like, and the engaging head 60 may be fixed together with the rear housing 10 by bonding, welding, clamping, screw connection, etc.

In addition, a material for the connecting assembly of the present disclosure is plastic. The use of plastic makes the connecting assembly lighter, less likely to be corroded, and have better elasticity and toughness, so that the connecting assembly has higher reliability. In addition, the material for the connecting assembly may also be metal, which is not limited in the present disclosure.

Based on the foregoing, it may be seen that multiple connecting assemblies may be disposed in the rear housing assembly according to an embodiment, and the type of the connecting assembly may be based on the actual installation position. For example, in an area where the sounding device is not disposed, the connecting assembly may be the connecting assembly as described in the second implementation. In an area where the sounding device is disposed, the connecting assembly may be the connecting assembly as described in the first implementation.

The present disclosure also provides a display device, which includes the above-mentioned rear housing assembly. For the beneficial effects of the display device, please refer to the description of the beneficial effects of the above-mentioned rear housing assembly, which will not be repeated here. The display device may be a display device such as a television, a computer display screen, and an advertisement screen.

Other embodiments of the present disclosure will be apparent to those skilled in the art from consideration of the specification and practice of the present disclosure disclosed herein. The present disclosure is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A rear housing assembly for a display device, comprising:
    a rear housing;
    a back plate, wherein the back plate and the rear housing are disposed oppositely in a thickness direction of the display device; and
    a connecting assembly, comprising a first connecting part and a second connecting part, wherein:
        one of the first connecting part and the second connecting part is coupled to the rear housing, and the other of the first connecting part and the second connecting part is coupled to the back plate;
        the first connecting part comprises a limiting cavity extending in the thickness direction, and the second connecting part comprises a limiting engaging portion, wherein the limiting engaging portion extends into the limiting cavity, and the limiting engaging portion is engaged with the first connecting part;
        the first connecting part further comprises a first cylindrical side wall, the first cylindrical side wall forms the limiting cavity, and the first cylindrical side wall is provided with a clamping hole; and
        the second connecting part further comprises a second cylindrical side wall, the limiting engaging portion is disposed on an outer side of the second cylindrical side wall in a protruding manner, and the limiting engaging portion is capable of extending into the limiting cavity and is clamped in the clamping hole.

2. The rear housing assembly according to claim 1, wherein a first mounting plate is disposed at an opening of a first end of the first cylindrical side wall, a first mounting portion is disposed on the back plate, and the first mounting plate is detachably coupled to the first mounting portion by a fastener.

3. The rear housing assembly according to claim 2, wherein one of the first mounting plate and the first mounting portion is provided with a positioning slot, and the other of the first mounting plate and the first mounting portion is provided with a positioning protrusion, the positioning protrusion being located in the positioning slot.

4. The rear housing assembly according to claim 2, wherein a second end of the first cylindrical side wall is open, and an edge of the second end of the first cylindrical side wall is inclined outward.

5. The rear housing assembly according to claim 2, wherein a first notch is disposed at the second end of the first cylindrical side wall.

6. The rear housing assembly according to claim 1, wherein a second mounting plate is disposed at an end of the second cylindrical side wall close to the first connecting part, a second mounting portion is disposed on the rear housing, and the second mounting plate is detachably coupled to the second mounting portion by a fastener.

7. The rear housing assembly according to claim 6, wherein a second notch is disposed at a second end of the second cylindrical side wall, a positioning sheet is disposed on the second mounting portion, and the positioning sheet is located in the second notch.

8. The rear housing assembly according to claim 1, wherein the second connecting part further comprises a limiting arm, the limiting arm is disposed on the outer side of the second cylindrical side wall in a protruding manner, and the limiting arm is located on a side of the limiting engaging portion away from the first connecting part.

9. The rear housing assembly according to claim 1, wherein a plurality of clamping holes are disposed along a circumferential direction of the first cylindrical side wall, and a number of the limiting engaging portions is the same as a number of the clamping holes.

10. The rear housing assembly according to claim 1, wherein the first connecting part is provided with two clamping holes, and the two clamping holes are symmetrically distributed on the first cylindrical side wall.

11. The rear housing assembly according to claim 1, wherein the first connecting part is the same as the second connecting part.

12. The rear housing assembly according to claim 1, further comprising a sounding device disposed between the rear housing and the back plate, wherein
    the sounding device is provided with an avoiding hole;
    an end of the first connecting part is coupled to the back plate, and the limiting cavity at the other end of the first connecting part extends into the avoiding hole; and
    an end of the second connecting part is coupled to the rear housing, and the limiting engaging portion at the other end of the second connecting part extends into the avoiding hole and is located within the limiting cavity.

13. The rear housing assembly according to claim 1, wherein the first connecting part comprises a first supporting wall and a second supporting wall disposed on the back plate oppositely, and a connecting plate connecting the first supporting wall and the second supporting wall;
    the connecting plate is provided with a through hole, and the connecting plate cooperates with the first supporting wall and the second supporting wall to form the limiting cavity; and
    the second connecting part further comprises a connecting arm, a first end of the connecting arm is coupled to the rear housing, the limiting engaging portion is disposed at a second end of the connecting arm in a protruding manner, and the limiting engaging portion is capable of extending into through hole and being clamped with the connecting plate via the through hole.

14. The rear housing assembly according to claim 13, wherein the first connecting part further comprises a first fixing arm and a second fixing arm, the first fixing arm is coupled to an end of the first supporting wall away from the connecting plate, the second fixing arm is coupled to an end of the second supporting wall away from the connecting plate, and the first fixing arm and the second fixing arm are also detachably coupled to the back plate respectively.

15. The rear housing assembly according to claim 14, wherein the first fixing arm is disposed on a side of the first supporting wall away from the second supporting wall, and the second fixing arm is disposed on a side of the second supporting wall away from the first supporting wall.

16. The rear housing assembly according to claim 13, wherein a plurality of connecting arms and a plurality of limiting engaging portions are provided, and there are gaps between the plurality of connecting arms.

17. A display device, comprising:
a rear housing assembly, wherein the rear housing assembly comprises:
a rear housing;
a back plate, wherein the back plate and the rear housing are disposed oppositely in a thickness direction of the display device; and
a connecting assembly, comprising a first connecting part and a second connecting part, wherein:
one of the first connecting part and the second connecting part is coupled to the rear housing, and the other of the first connecting part and the second connecting part is coupled to the back plate;
the first connecting part comprises a limiting cavity extending in the thickness direction, and the second connecting part comprises a limiting engaging portion, wherein the limiting engaging portion extends into the limiting cavity, and the limiting engaging portion is engaged with the first connecting part;
the first connecting part further comprises a first cylindrical side wall, the first cylindrical side wall forms the limiting cavity, and the first cylindrical side wall is provided with a clamping hole; and
the second connecting part further comprises a second cylindrical side wall, the limiting engaging portion is disposed on an outer side of the second cylindrical side wall in a protruding manner, and the limiting engaging portion is capable of extending into the limiting cavity and is clamped in the clamping hole.

18. The display device according to claim 17, wherein:
the rear housing assembly further comprises a sounding device disposed between the rear housing and the back plate, wherein
the sounding device is provided with an avoiding hole;
an end of the first connecting part is coupled to the back plate, and the limiting cavity at the other end of the first connecting part extends into the avoiding hole; and
an end of the second connecting part is coupled to the rear housing, and the limiting engaging portion at the other end of the second connecting part extends into the avoiding hole and is located within the limiting cavity.

19. A rear housing assembly for a display device, comprising:
a rear housing;
a back plate, wherein the back plate and the rear housing are disposed oppositely in a thickness direction of the display device;
a connecting assembly comprising a first connecting part and a second connecting part; and
a sounding device disposed between the rear housing and the back plate, wherein:
one of the first connecting part and the second connecting part is coupled to the rear housing, and the other of the first connecting part and the second connecting part is coupled to the back plate;
the first connecting part comprises a limiting cavity extending in the thickness direction, and the second connecting part comprises a limiting engaging portion;
the limiting engaging portion extends into the limiting cavity, and the limiting engaging portion is engaged with the first connecting part;
the sounding device is provided with an avoiding hole;
an end of the first connecting part is coupled to the back plate, and the limiting cavity at the other end of the first connecting part extends into the avoiding hole; and
an end of the second connecting part is coupled to the rear housing, and the limiting engaging portion at the other end of the second connecting part extends into the avoiding hole and is located within the limiting cavity.

20. The rear housing assembly according to claim 19, wherein:
the first connecting part comprises a first supporting wall and a second supporting wall disposed on the back plate oppositely, and a connecting plate connecting the first supporting wall and the second supporting wall;
the connecting plate is provided with a through hole, and the connecting plate cooperates with the first supporting wall and the second supporting wall to form the limiting cavity; and
the second connecting part further comprises a connecting arm, a first end of the connecting arm is coupled to the rear housing, the limiting engaging portion is disposed at a second end of the connecting arm in a protruding manner, and the limiting engaging portion is capable of extending into through hole and being clamped with the connecting plate via the through hole.

* * * * *